US009065399B2

(12) United States Patent
Wang et al.

(10) Patent No.: US 9,065,399 B2
(45) Date of Patent: Jun. 23, 2015

(54) PROGRAMMABLE HIGH-SPEED VOLTAGE-MODE DIFFERENTIAL DRIVER

(71) Applicant: ALTERA CORPORATION, San Jose, CA (US)

(72) Inventors: Bonnie I. Wang, Cupertino, CA (US); Weiqi Ding, Fremont, CA (US); Tim Tri Hoang, San Jose, CA (US); Richard Hernandez, San Jose, CA (US); Haidang Lin, Redwood City, CA (US)

(73) Assignee: Altera Corporation, San Jose, CA (US)

( * ) Notice: Subject to any disclaimer, the term of this patent is extended or adjusted under 35 U.S.C. 154(b) by 57 days.

(21) Appl. No.: 13/918,480

(22) Filed: Jun. 14, 2013

(65) Prior Publication Data

US 2014/0368272 A1    Dec. 18, 2014

(51) Int. Cl.
*H03F 3/45* (2006.01)
*H04L 25/02* (2006.01)
*H03K 19/0185* (2006.01)

(52) U.S. Cl.
CPC ........ *H03F 3/45071* (2013.01); *H04L 25/0272* (2013.01); *H03K 19/018514* (2013.01); *H03K 19/018585* (2013.01)

(58) Field of Classification Search
CPC .............. H04L 25/0272; H04L 25/028; H04L 25/0292; H03K 19/018585; H03K 19/00361; H03K 19/01721
USPC ........................... 326/82, 86, 87, 68, 112, 115
See application file for complete search history.

(56) References Cited

U.S. PATENT DOCUMENTS

| | | | |
|---|---|---|---|
| 6,864,704 B1 | 3/2005 | Wong et al. | |
| 6,940,302 B1 | 9/2005 | Shumarayev et al. | |
| 6,943,588 B1 | 9/2005 | Luo et al. | |
| 6,972,588 B1 | 12/2005 | Wong et al. | |
| 7,109,743 B2 | 9/2006 | Shumarayev et al. | |
| 7,236,018 B1 | 6/2007 | Wang et al. | |
| 7,245,144 B1 | 7/2007 | Wong et al. | |
| 7,307,446 B1 | 12/2007 | Shumarayev et al. | |
| 7,397,270 B1 * | 7/2008 | Luo et al. ......................... | 326/32 |
| 7,411,421 B1 | 8/2008 | Steinke et al. | |
| 7,551,014 B1 | 6/2009 | Wang et al. | |
| 7,675,326 B1 * | 3/2010 | Luo et al. ......................... | 326/86 |
| 2006/0220685 A1 | 10/2006 | Jordy | |
| 2010/0079167 A1 | 4/2010 | Thomsen | |

(Continued)

OTHER PUBLICATIONS

EPO extended Search Report for Application No. 14169882.9, Jan. 14, 2015, 6 sheets.

*Primary Examiner* — Dylan White
(74) *Attorney, Agent, or Firm* — Okamoto & Benedicto LLP

(57) ABSTRACT

A voltage-mode differential driver is disclosed. The differential driver includes two driver arms, each driver arm including a variable-impedance driver for driving a single-ended output signal. Each variable-impedance driver comprises multiple driver slices, where each driver slice includes a pre-driver circuit and a driver circuit. Advantageously, it has been determined that the disclosed voltage-mode driver design requires less power than conventional current-mode drivers. In one implementation, the disclosed voltage-mode driver design provides the capability of independently programming the delay of the two single-ended outputs so as to compensate for differential skew. Other embodiments and features are also disclosed.

19 Claims, 13 Drawing Sheets

(56) References Cited

U.S. PATENT DOCUMENTS

| | | | |
|---|---|---|---|
| 2010/0253300 A1* | 10/2010 | Garez et al. | 323/282 |
| 2012/0054704 A1* | 3/2012 | Boecker | 716/110 |
| 2012/0299616 A1 | 11/2012 | Liu et al. | |
| 2012/0309456 A1* | 12/2012 | Yamamoto et al. | 455/557 |
| 2013/0009669 A1* | 1/2013 | Rao | 327/108 |
| 2013/0120029 A1 | 5/2013 | Li et al. | |
| 2013/0163126 A1* | 6/2013 | Dong | 361/56 |
| 2014/0320229 A1* | 10/2014 | Ali | 333/17.3 |

* cited by examiner

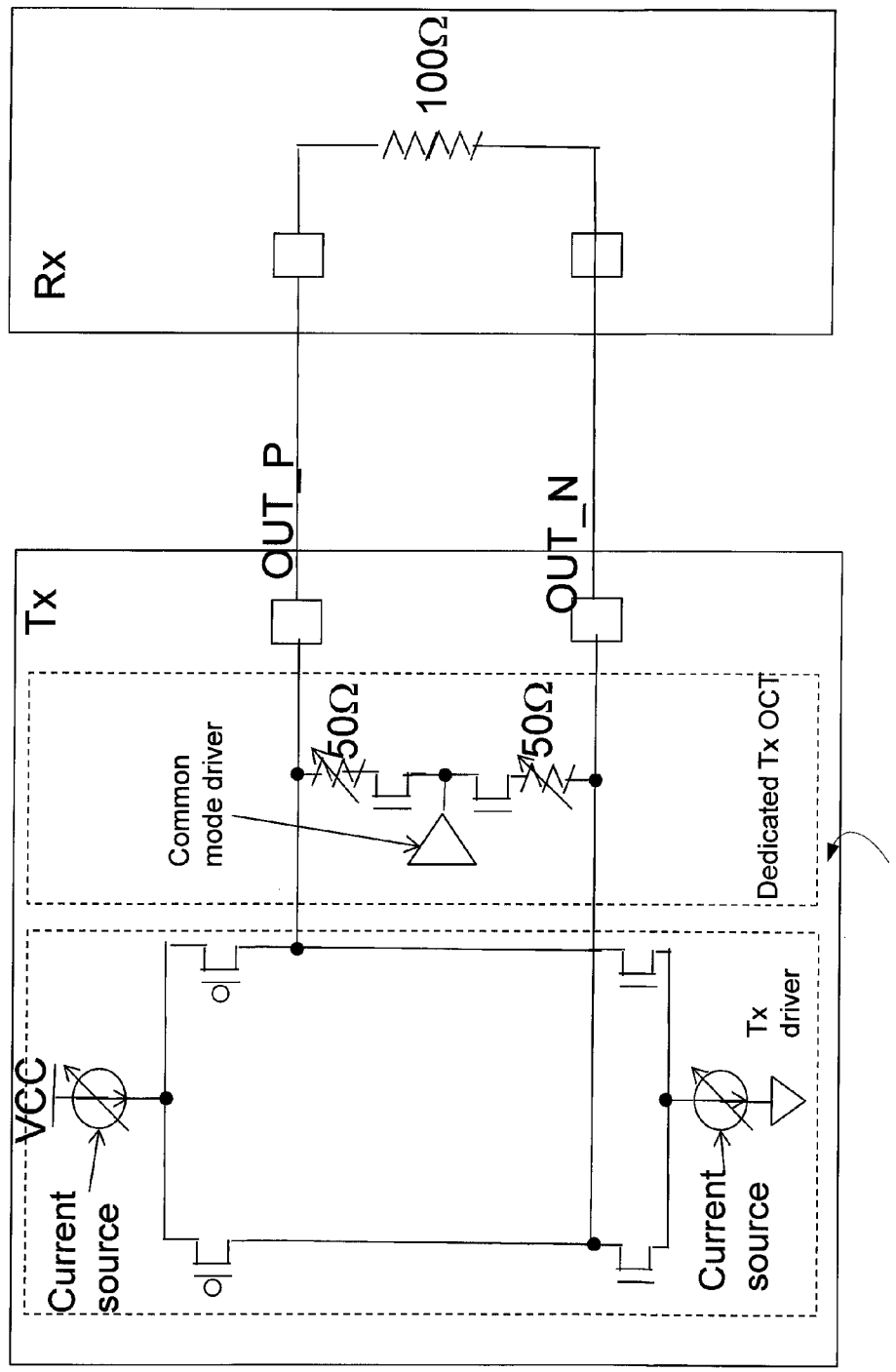
FIG. 8
(Conventional)

PROGRAMMABLE HIGH-SPEED VOLTAGE-MODE DIFFERENTIAL DRIVER

BACKGROUND

1. Technical Field

The present invention relates generally to data communications. More particularly, the present invention relates to a differential output driver.

2. Description of the Background Art

Differential input/output (IO) standards are used in many high-speed applications. Many different IO standards, such as Low Voltage Differential Signaling (LVDS) and Pseudo Current Mode Logic (PCML), use current mode output drivers.

In a current mode output driver, the programmable output voltage (VOD) is generally determined by the output current provided by the current sources. The output impedance may be determined by dedicated on-chip output termination (OCT).

SUMMARY

One embodiment relates to a voltage-mode differential driver. The differential driver includes two driver arms, each driver arm including a variable-impedance driver for driving a single-ended output signal. Each variable-impedance driver comprises multiple driver slices, where each driver slice includes a pre-driver circuit and a driver circuit. Advantageously, it has been determined that the disclosed voltage-mode driver design requires less power than conventional current-mode drivers. In one implementation, the disclosed voltage-mode driver design provides the capability of independently programming the delay of the two single-ended outputs so as to compensate for differential skew.

Other embodiments and features are also disclosed.

BRIEF DESCRIPTION OF THE DRAWINGS

FIG. 8 shows a conventional current-mode driver.

DETAILED DESCRIPTION

Applicants have determined that, as the frequency of the IO signals increases, some issues arise that limit the performance of the current mode output drivers conventionally used in high-speed IO standards.

For example, the delay skew between the positive and negative arms of the differential signals may become problematic. At 30 gigabits per second (Gbps), one unit interval (UI) is only on the order of 30 picoseconds (ps). Hence, at this data rate, a few picosecond skew between the two receiver (RX) inputs may substantially reduce the size of the input signal eye-diagram openings. To prevent such reduction in the eye-diagram openings, the printed circuit board (PCB) trace lengths of the differential pair must be matched very accurately, i.e. perhaps within a few hundred microns.

Another issue that arises is an increase in power consumption. Due to the high impedance of the current sources, the current-mode driver requires parallel output termination to achieve 100 ohm output impedance. This causes 50% of the current to be shunted through the termination.

In addition, the current-mode driver also requires a good current source to get an accurate pre-emphasis ratio. To achieve the accuracy, sufficient voltage head room is required. That requirement leads to higher power supply voltage and power.

Furthermore, at high speeds, the rise and fall times of the output buffer become more important. One way to speed up the output edge rate is to add an inductive T-coil in series with the outputs to "cancel" part of the output pin capacitance. However, the parasitic resistance of the T-coil has to be added to the output impedance. This forces the value of the parallel termination to be lowered, causing more current being shunted through parallel termination and more power consumption.

The present disclosure provides a programmable high-speed voltage-mode differential driver to solve or ameliorate the issues discussed above with conventional current-mode differential drivers. The driver may be programmable in output impedance, output voltage swing, pre-emphasis ratio, skew between two outputs, duty cycle and common mode voltage.

Figure 1:
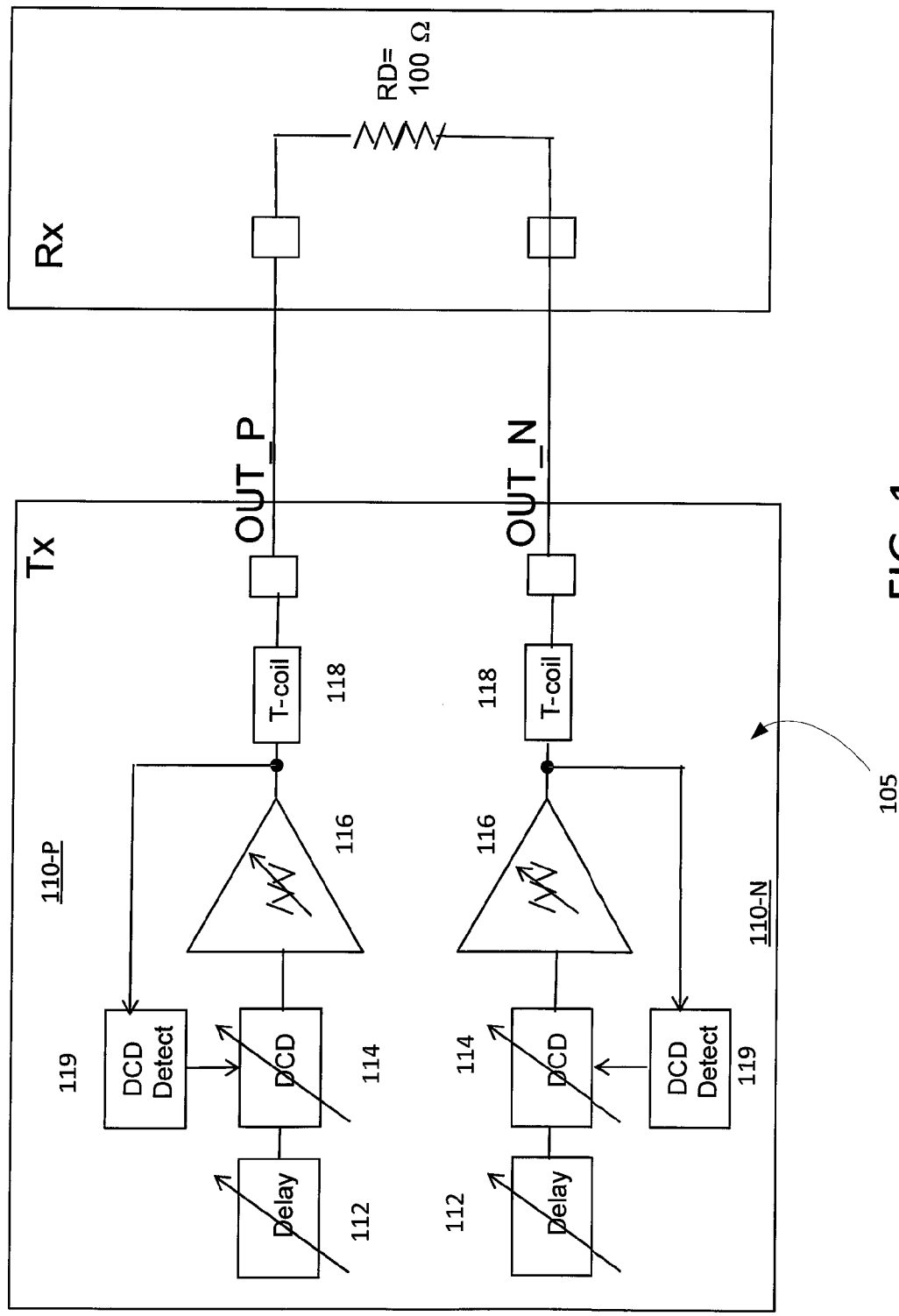
FIG. 1 depicts select components of a programmable high-speed voltage-mode differential driver in accordance with an embodiment of the invention.

FIG. 1 depicts select components of a programmable high-speed voltage-mode differential driver 105 in accordance with an embodiment of the invention. As shown, the voltage-mode differential driver 105 at the transmitter (Tx) is made of two single-ended drivers (110-P and 110-N) that drive the two output signals on the two output pins, OUT_P and OUT_N. Each pin is driven by a corresponding single-ended driver. In this example, the termination at the receiver is shown as RD=100 ohms.

As depicted in FIG. 1, each single-ended driver 110 (-P or -N) may include a delay control (skew control) circuit 112, a duty cycle distortion (DCD) control circuit 114, a variable-output-impedance driver circuit 116, a T-coil 118, and a DCD detection circuit 119. The output of the delay control circuit 112 may be input to the DCD control circuit 114, and the output of the DCD control circuit 114 may be input to the input of the variable-output-impedance driver circuit 116. The output of the variable-output-impedance driver circuit 116 may be provided to the input of the T-coil 118, and the output of the T-coil 118 may drive the output signal onto the output pin (OUT_P or OUT_N, depending on the arm). In addition, the output of the driver circuit 116 may be input to the DCD detection circuit 119 which controls the DCD control circuit 114. These components and their operations are described in further detail below.

Note that, in accordance with an embodiment of the invention, the delays of the two output signals driven onto OUT_P and OUT_N may be programmed independently. This enables the cancellation of any reasonable delay skew on packages, the PCB board or in the receiver device to achieve optimal signal eye-diagram openings.

Figure 2:
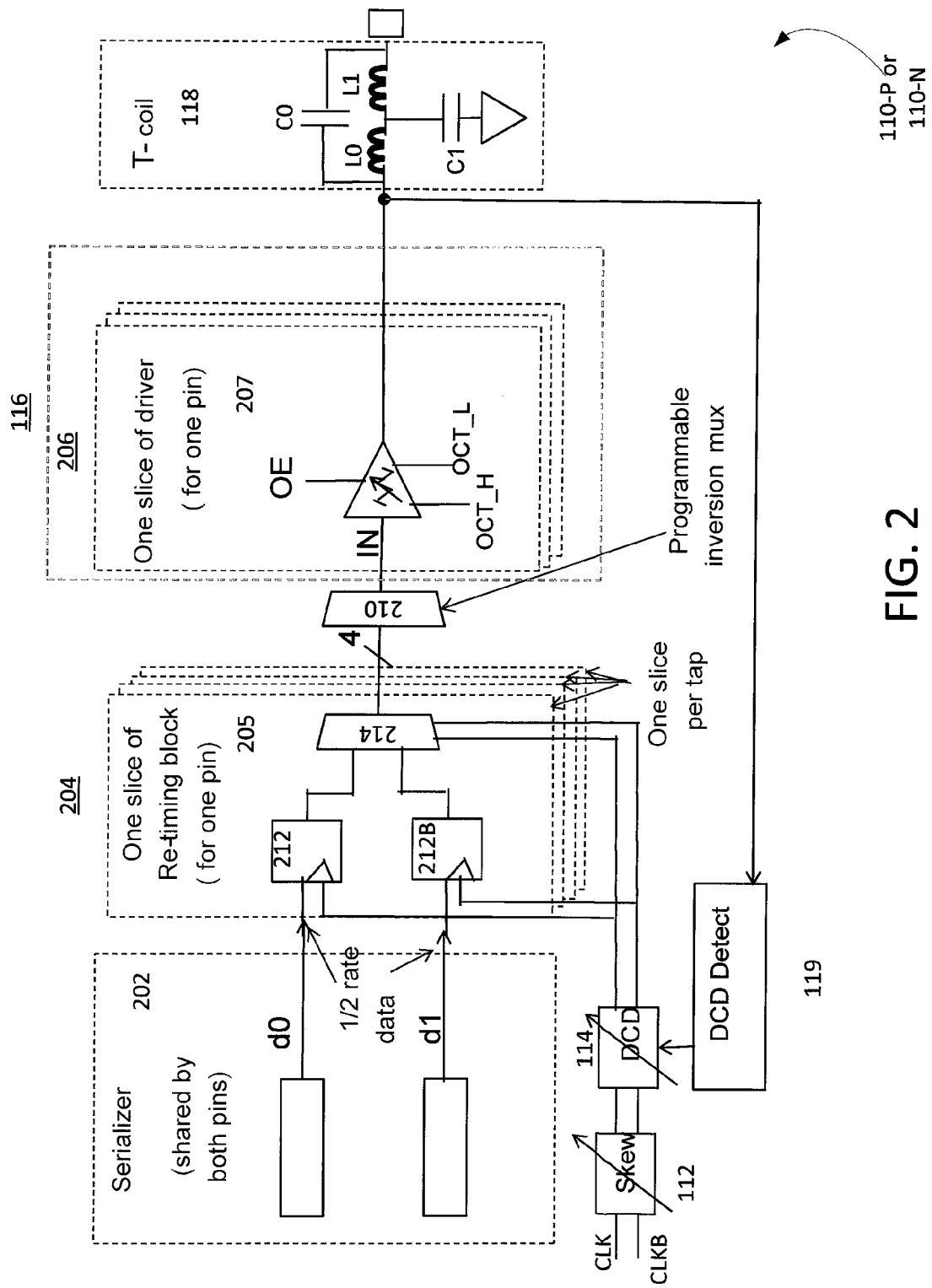
FIG. 2 is a block diagram of one arm of the voltage-mode driver in accordance with an embodiment of the invention.

FIG. 2 is a block diagram of one arm (110-P or 110-N) of the voltage-mode driver 105, including the shared serializer and the re-timing/output circuit for one pin, in accordance with an embodiment of the invention. As shown in FIG. 2, the data inputs (d0 and d1) into each single-ended driver (110-P or 110-N) may be half-rated data (d0 and d1) from a serializer 202. As such, the serializer 202 is shared by both arms (110-P and 110-N) of the voltage-mode driver 105. As further shown, the variable-output-impedance driver circuit 116 may be implemented as a driver block 206 with multiple driver slices 207 arranged in parallel with each other.

Pre-emphasis may be used to cancel the high-frequency loss of signal links. Each pre-emphasis tap corresponds to one slice 205 of the re-timing block 204. In the example depicted in FIG. 2, there are four pre-emphasis taps (for example, main, post 1 post 2, and pre) corresponding to four slices 205 of the re-timing block 204. The output of each re-timing slice 205 may drive one driver slice 207 of the driver block 206.

Within each re-timing slice 205, two registers (212 and 212B) may receive the half-rate data (d0 and d1, respectively). The output of the registers (212 and 212B) may be output to a half-rate-to-full-rate MUX 214. The MUX 214 multiplexes the two half-rate data signals into a full-rate data signal.

The timing of the output from each re-timing slice 205 may be controlled by the clock signal CLK and its inverted version CLKB which are sent to the clock inputs of the registers (212 and 212B, respectively) of each re-timing slice 205. The delays of CLK and CLKB (and, hence, the skew between them) may be programmable by delay control (skew control) circuit 112.

In addition, the duty cycles of CLK and CLKB may be programmable by DCD control circuit 114. These duty cycles may be calibrated during power up before entering user mode. The DCD detection circuit 119 may be subsequently used to determine the optimal setting of the DCD control circuit 114 during calibration.

The multiple (in this example, four) re-timed full-rate data signals from the multiple (in this example, four) re-timing slices 205 may be received by a programmable inversion MUX 210. The programmable inversion MUX 210 provides the input signal (IN) for the multiple driver slices 207 of the driver block 206. An exemplary circuit for a driver slice 207 is described below in relation to FIGS. 3 and 4. In one embodiment, for example, there may be at least one hundred (100) driver slices 207 arranged in parallel.

A T-coil 118 is placed between the output driver and pin on each of the two outputs of the differential pair, one such output being shown in FIG. 2. In order to allow the delay of each output to be programmed independently, the T-coil on each output is independent, with small or minimal mutual coupling. As depicted, the T-coil 118 may connect the output of the driver slices 207 to the output terminal of that driver arm using a first capacitor C0 in parallel with two inductors L0 and L1. C1 represents the parasitic capacitance of the electrostatic discharge (ESD) circuit for the T-coil 118.

Figure 3:
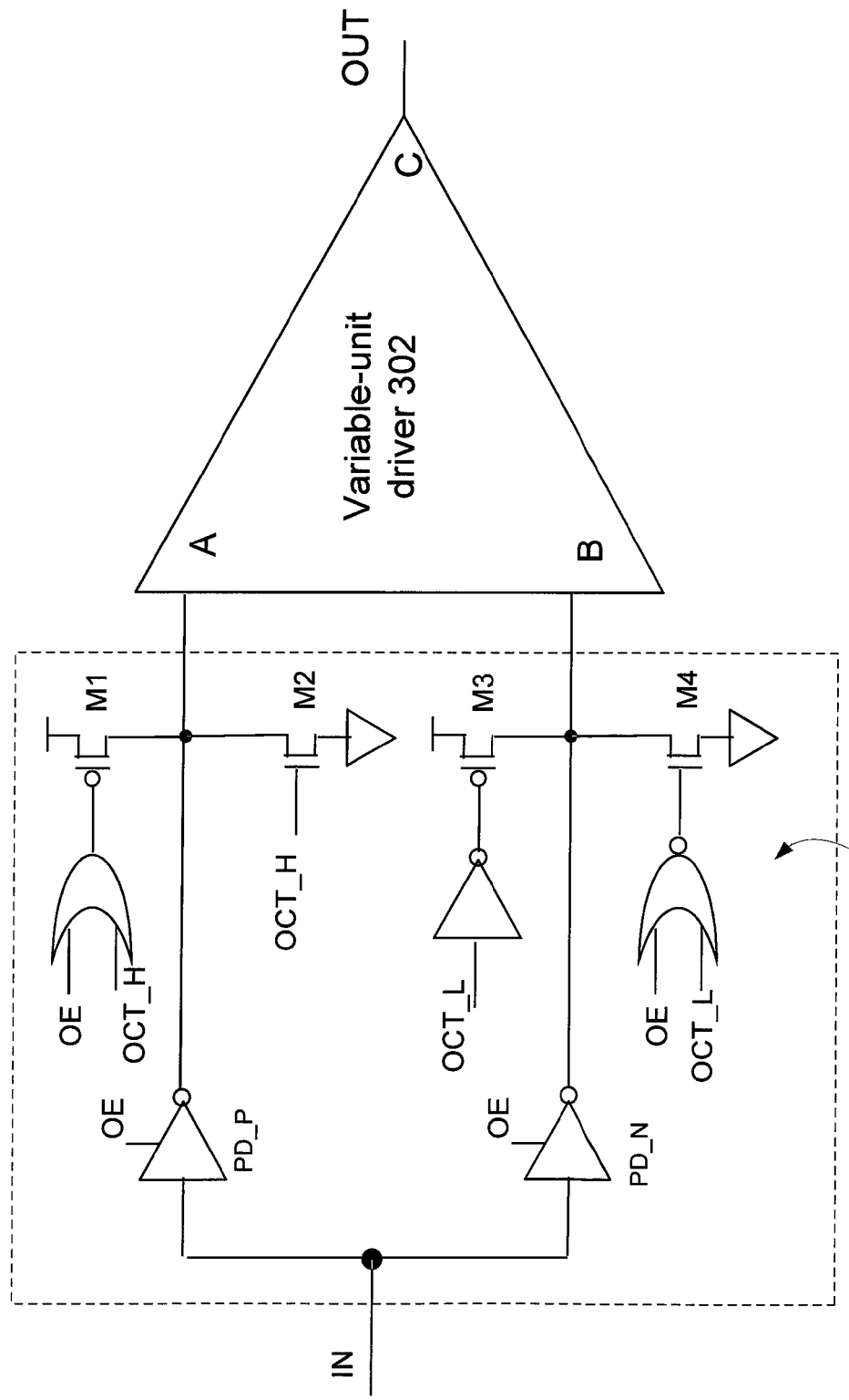
FIG. 3 depicts one driver slice in accordance with an embodiment of the invention.

FIG. 3 depicts one driver slice 207 in accordance with an embodiment of the invention. As shown, each driver slice 207 includes a variable-unit driver 302 that is driven by a pre-driver circuit 304. The data input pin IN may receive the output signal of the corresponding re-timing slice 205 via the programmable inversion MUX 210.

In accordance with an embodiment of the invention, each driver slice 207 may have four states, depending on the logical states of the control signals to the pre-driver circuit 304. As shown in FIG. 3, in this implementation, the control signals are OE, OCT_H and OCT_L.

In the first state, the driver slice 207 is used as an output driver. The control signals for this state are: OE is high; OCT_H is low; and OCT_L is low. As a result, transistors M1-M4 are turned off, and pre-driver circuits PD_P and PD_N are enabled (due to OE being high). The pre-driver circuits PD_P and PD_N receive the input signal IN and output signals that drive the input nodes A and B of the variable-unit driver 302. The variable-unit driver 302 outputs a signal on its output node C that contributes to driving the signal on the OUT node. Hence, in this first state, the signal on the IN pin for this driver slice 207 contributes to driving the signal on the OUT pin.

In the second state, the driver slice 207 is not used. The control signals for this second state are: OE is low; OCT_H is low; and OCT_L is low. In this second state, PD_P and PD_N are tri-stated, M2 and M3 turned off, and M1 and M4 are turned on. As a result, the OUT node is tri-stated for this driver slice 207.

In the third state, the driver slice 207 is used as on chip termination (OCT) and always drives to the high state. The control signals for this state are: OE is low; OCT_H is high; and OCT_L is low. In this third state, PD_P and PD_N are tri-stated, M2 and M4 turned on, and M1 and M3 are turned off. As a result, the OUT node is driven to high constantly by this driver slice.

In the fourth state, the driver slice 207 is used as OCT and always drives to the low state. The control signals for this state are: OE is low; OCT_H is low; and OCT_L is high. In this fourth state, PD_P and PD_N are tri-stated, M1 and M3 turned on, and M2 and M4 are turned off. As a result, the OUT node is driven to low constantly by this driver slice.

Figure 4:
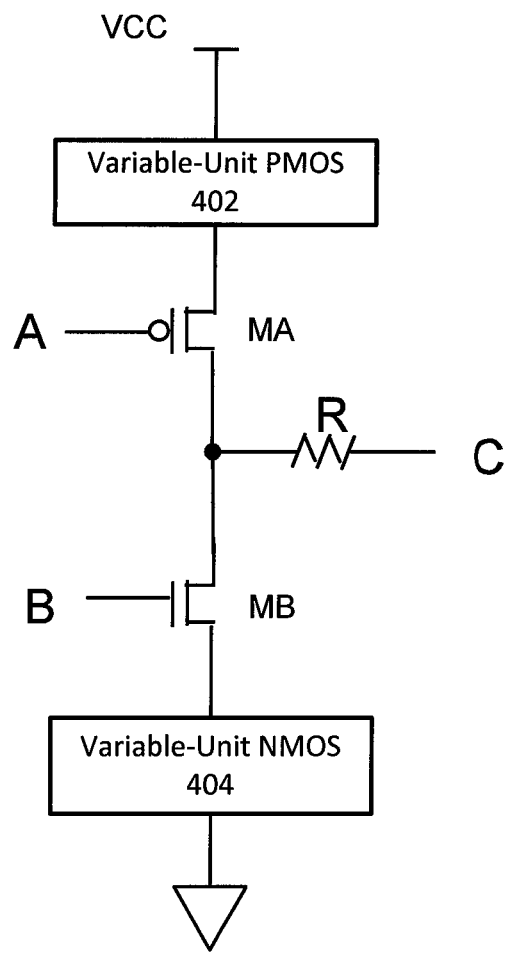
FIG. 4 depicts a variable-unit driver in accordance with an embodiment of the invention.

FIG. 4 depicts a variable-unit driver 302 in accordance with an embodiment of the invention. In one embodiment, the variable-unit drivers 302 may each be tuned to have a fixed output impedance. For instance, each variable-unit driver 302 may be tuned to have a five-thousand (5,000) ohm output impedance, such that one hundred (100) variable-unit drivers 302 in parallel would have a 50 ohm output impedance.

The variable-unit driver 302 has input nodes A and B and output node C. As depicted, the variable-unit driver 302 includes input nodes A and B, PMOS transistor MA, NMOS transistor MB, a variable-unit PMOS circuit 402, a variable-unit NMOS circuit 404, and series termination R. Exemplary implementations of the variable-unit PMOS circuit 402 and the variable-unit NMOS circuit 404 are described below in relation to FIGS. 5A and 5B, respectively.

The series termination R may be used to achieve a more linear output current-voltage (IV) characteristic curve and reduce the effect of process skew between NMOS and PMOS transistors. Reducing the process skew effect allows for a fixed ratio of NMOS and PMOS strengths. This makes the calculation of the pre-emphasis ratio simpler, since PMOS and NMOS will always have the same pre-emphasis ratio.

Figure 5A:
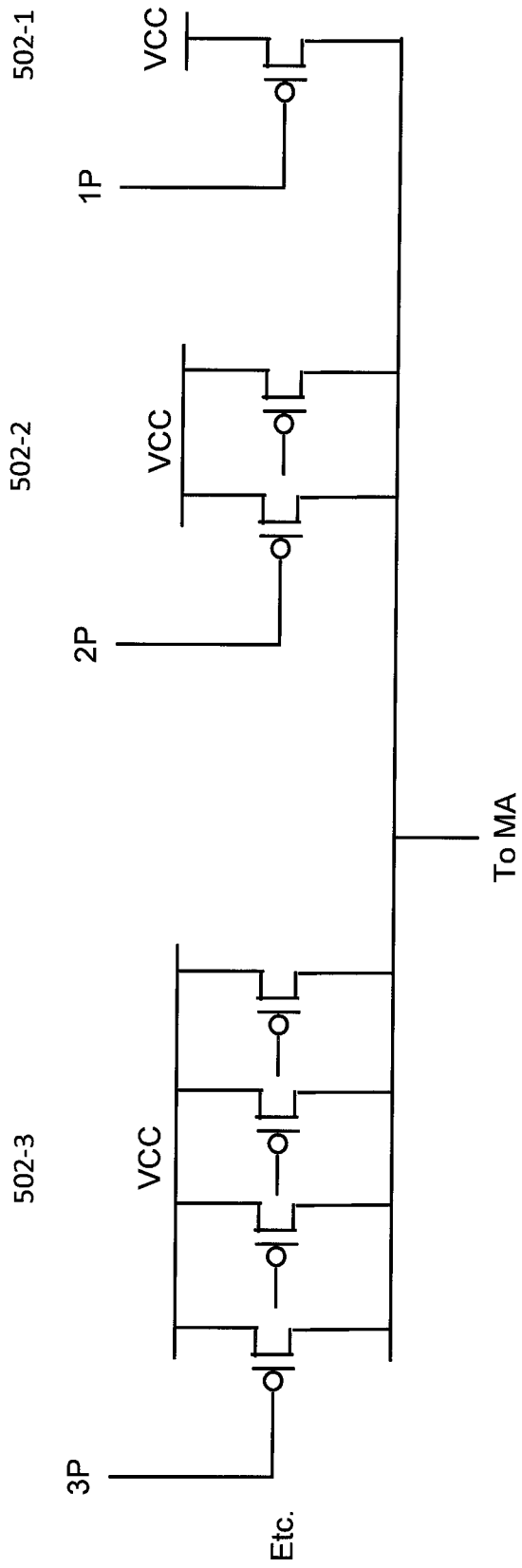
FIG. 5A depicts a variable-unit PMOS circuit in accordance with an embodiment of the invention.

As shown in FIG. 5A, the variable-unit PMOS circuit 402 includes multiple sets of PMOS transistors arranged in parallel. A first PMOS set 502-1 includes one PMOS transistor. A second PMOS set 502-2 includes two PMOS transistors in parallel. A third PMOS set 502-3 includes four PMOS transistors in parallel. And so on. While three sets are depicted, more sets may be included. For example, a fourth PMOS set would eight PMOS transistors in parallel, and a fifth PMOS set would include sixteen PMOS transistors in parallel. More generally, an nth PMOS set may include $2^{n-1}$ PMOS transistors in parallel.

Control signals (1P, 2P, 3P, etc.) may be used to control which PMOS transistor sets 502 are in use and which are not in use. The first control signal 1P may be reset (low) when the first PMOS set 502-1 is in use and set (high) when it is not. The second control signal 2P may be reset (low) when the second PMOS set 502-2 is in use and set (high) when it is not. The third control signal 3P may be reset (low) when the third PMOS set 502-3 is in use and set (high) when it is not. And so on. More generally, an nth control signal may be reset (low) when the nth PMOS set is in use and set (high) when it is not.

Figure 5B:
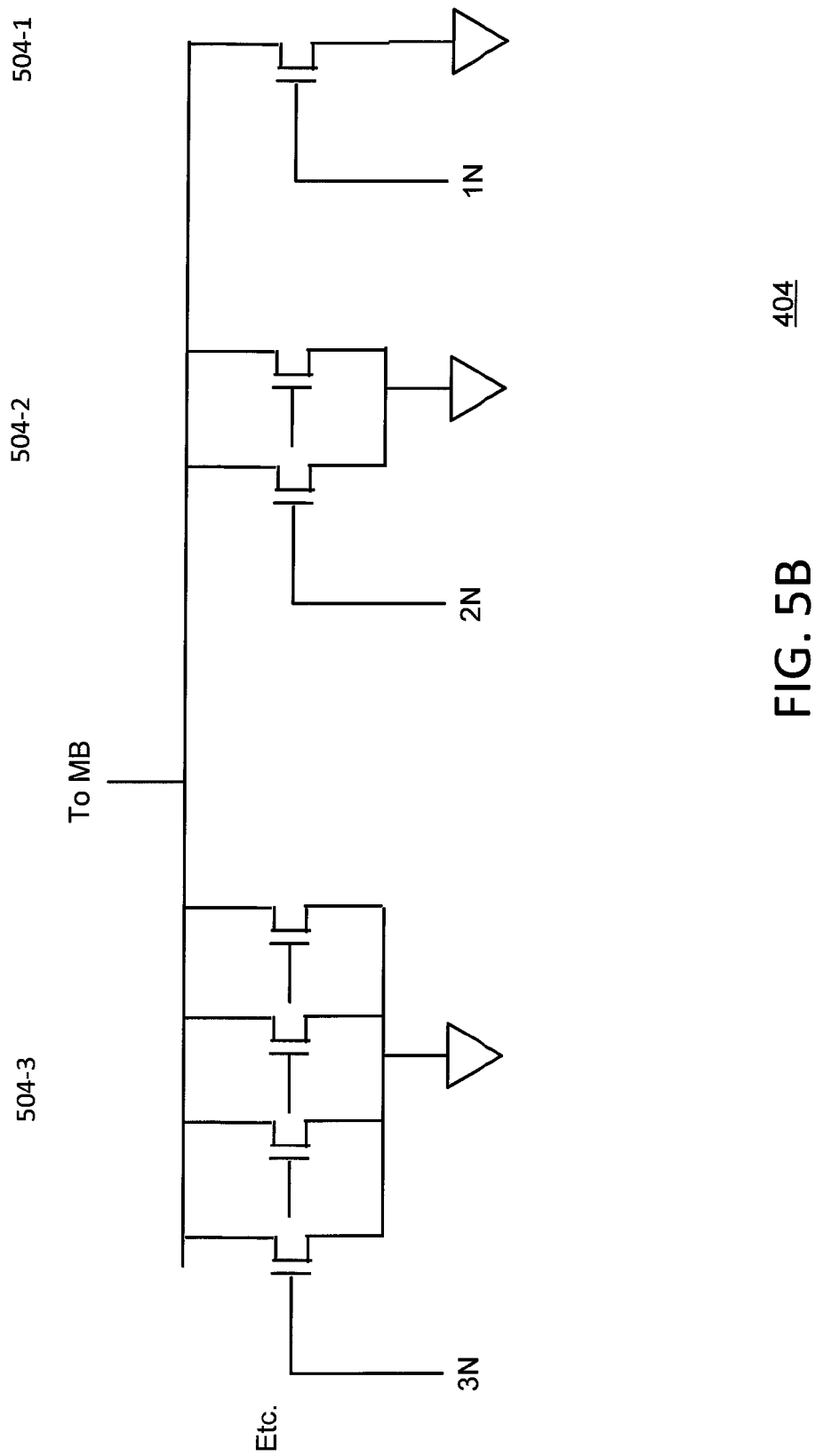
FIG. 5B depicts a variable-unit NMOS circuit in accordance with an embodiment of the invention.

Similarly, as shown in FIG. 5B, the variable-unit NMOS circuit 404 includes multiple sets of NMOS transistors arranged in parallel. A first NMOS set 504-1 includes one NMOS transistor. A second NMOS set 504-2 includes two NMOS transistors in parallel. A third NMOS set 504-3 includes four NMOS transistors in parallel. And so on. While three sets are depicted, more sets may be included. For example, a fourth NMOS set would eight NMOS transistors in parallel, and a fifth NMOS set would include sixteen NMOS transistors in parallel. More generally, an nth NMOS set may include $2^{n-1}$ NMOS transistors in parallel Control signals (1N, 2N, 3N, etc.) may be used to control which NMOS transistor sets 504 are in use and which are not in use. The first control signal 1N may be set (high) when the first NMOS set 504-1 is in use and reset (low) when it is not. The second control signal 2N may be set (high) when the second NMOS set 504-2 is in use and reset (low) when it is not. The third control signal 3N may be set (high) when the third NMOS set 504-3 is in use and reset (low) when it is not. And so on. More generally, an nth control signal may be set (high) when the nth NMOS set is in use and reset (low) when it is not.

In one implementation, control signals 1P, 2P, 3P, etc. may be complements of the control signals 1N, 2N, 3N, etc., respectively. As such, the nth PMOS set and the nth NMOS set are generally either both turned on or both turned off. In an alternate implementation, the control signals 1P, 2P, 3P, etc. may be set independently from the control signals 1N, 2N, 3N, etc. In this case, greater flexibility is provided for the tuning of each variable-unit driver 302.

The variable-unit PMOS and NMOS drivers (402 and 404) may be configured to allow any number of "driver units" (up to the maximum number available) to be used in the variable-unit driver 302. For example, if eleven driver units are to be turned on, then the control signals may turn on the first, second and fourth transistor sets in each variable-unit driver (402 and 404) and may turn off the remaining transistor sets. The first, second and fourth transistor sets have one, two and eight driver units, respectively, for a total of eleven driver units. As another example, if twenty-six driver units are to be turned on, then the control signals may turn on the second, fourth and fifth transistor sets in each variable-unit driver (402 and 404) and may turn off the remaining transistor sets. The second, fourth and fifth transistor sets have two, eight and sixteen driver units, respectively, for a total of twenty-six driver units.

The output impedance seen from the OUT pin of each arm (110-P and 110-N) is hence programmable and is determined by the number of driver units that are used in parallel. With a specified output impedance, the total number of driver units to be used may be determined during calibration. For example, if the impedance due to one driver unit being used is 5,000 ohms, then 100 driver units being used in parallel will result in an output impedance of 50 ohms.

The differential output voltage VOD is determined by the output current going through the receiver-side termination resistor RD shown in FIG. 1. VODpp is the peak-to-peak voltage difference between OUT_P and OUT_N pins. For example, if both the output driver arms (110-P and 110-N) which drive OUT_P and OUT_N have an output impedance of 50 ohms and RD=100 ohms, then the voltage difference between OUT_P and OUT_N will range from minus ½ VCC to plus ½ VCC, so the VODpp becomes VCC (the power supply voltage).

With a given output impedance per driver unit used, the maximum VOD swing can be achieved by using all the available driver units as signal drivers. In this case, all current going through the driver units is going to the receiver as output current. Of course, lesser VOD swings, below the maximum, may also be achieved.

In accordance with an embodiment of the invention, the differential output voltage VOD is programmable. There is more than one way to reduce the VOD below the maximum VOD.

Figure 6:
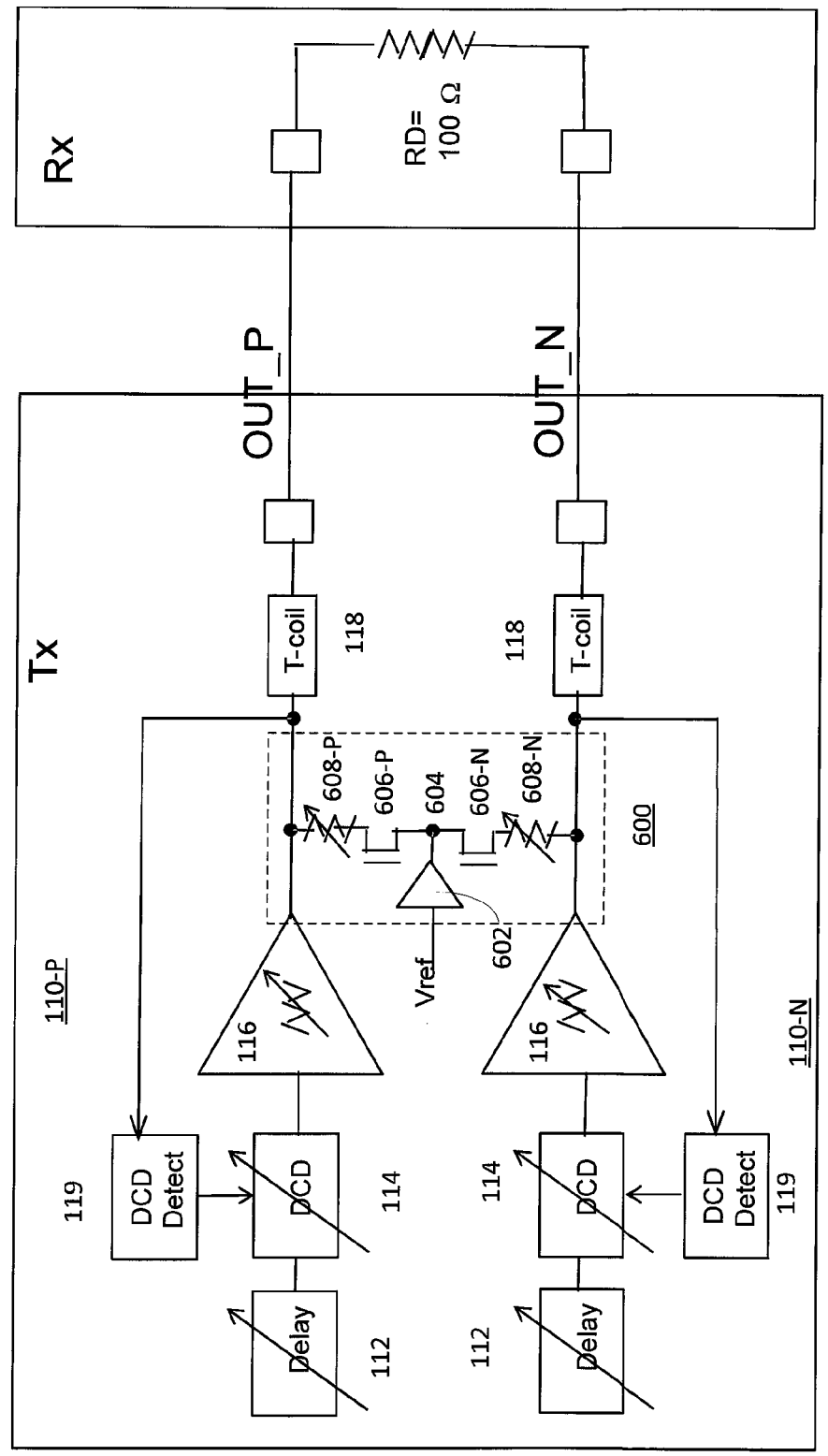
FIG. 6 depicts the arrangement of dedicated OCT circuitry between the positive and negative arms of the voltage-mode driver in accordance with an embodiment of the invention.

One method to reduce VOD below the maximum VOD is to use dedicated OCT circuitry 600 between the positive and negative arms of the differential pair, as shown in FIG. 6. The dedicated OCT circuitry 600 provides for output termination with low power consumption. As shown, the dedicated OCT circuitry includes a common mode driver 602 which drives a reference voltage (Vref) onto common mode node 604. The node 604 is connected by transistor 606-P and variable resistor 608-P in series to the output of the variable-output impedance driver 116 of the single-ended driver 110-P and is also connected by transistor 606-N and variable resistor 608-N in series to the output of the variable-output impedance driver 116 of the single-ended driver 110-N. The circuit 600 of FIG. 6 provides for a programmable output offset voltage (VOS). The VOS is programmable by varying the reference voltage (Vref) of the common mode driver.

Figure 7:
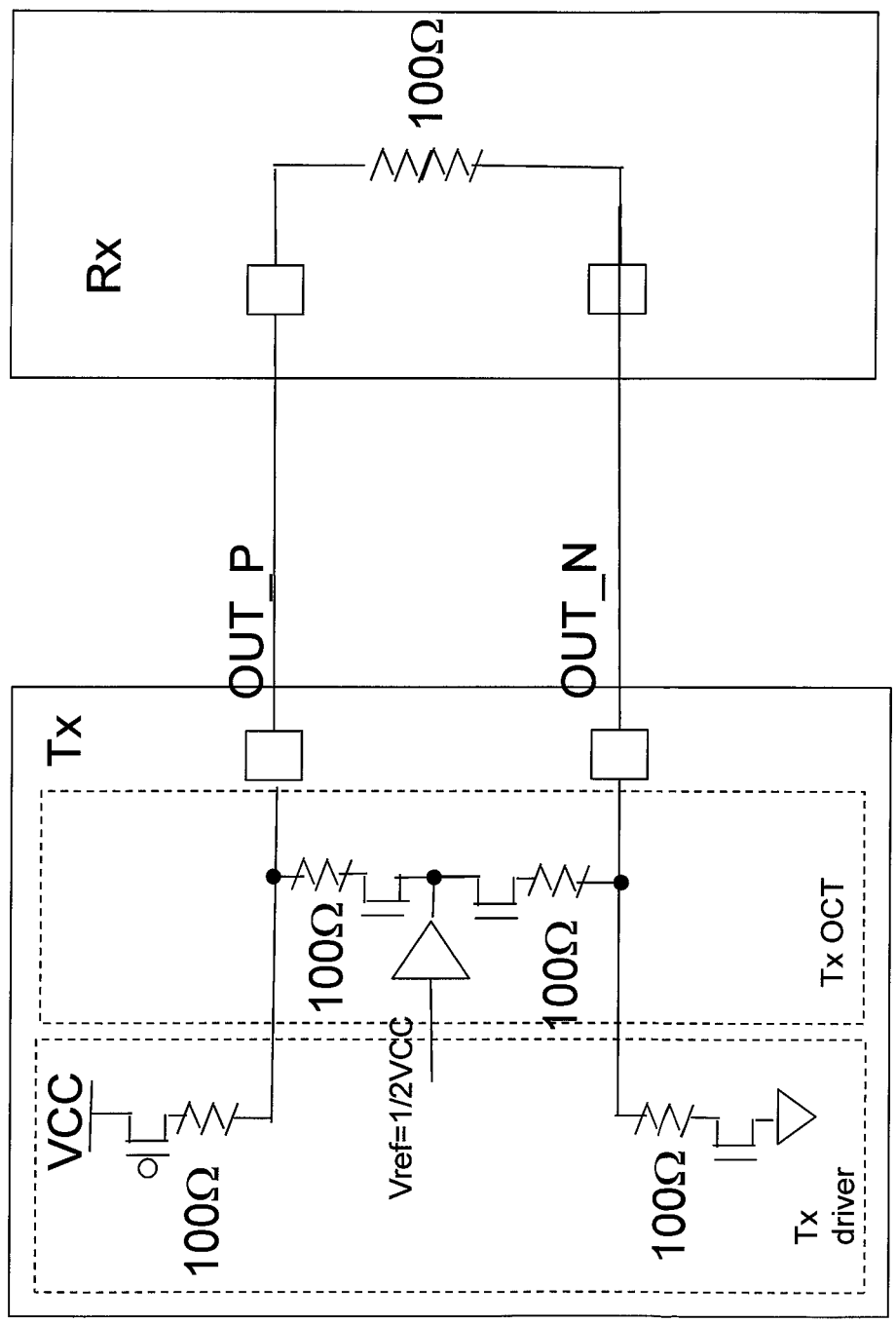
FIG. 7 shows an example use of a voltage-mode driver with dedicated OCT in accordance with an embodiment of the invention.

An example use of the dedicated OCT circuitry 600 is shown in FIG. 7. In this example, the output impedance for each driver arm (110-P and 110-N) of the Tx driver is 100 ohms. Each variable resistor (608-P and 608-N) is set to 100 ohms, and Vref is set to ½ VCC (such that VODpp=VCC/2). In this case, with VCC=1.1 volts, the DC current for the circuit in FIG. 7 is only 4.1 mA (excluding current consumption of the common mode driver).

In comparison, the equivalent current mode (H tree) driver 800 shown in FIG. 8 will consume 5.5 mA (excluding common mode driver current) to achieve VODpp=VCC/2. The current-mode driver consumes more current due to the 100 ohms dedicated output termination. This termination is required to meet 100 ohms output impedance, regardless of VOD, since the impedance of the driver itself is very high due to the current sources.

Another method to reduce VOD below the maximum VOD is to lower the power supply voltage VCC. Lower VCC may be achieved by using an on-chip voltage regulator as the power supply for the voltage-mode driver. Using such a voltage regulator may also reduce PVT variation of the transmitter driver impedance and noise coupling between circuitry.

This method of lowering VCC may be combined with other methods (such as the use of dedicated OCT circuitry described above).

In a third method, to reduce VOD without changing output impedance, some driver units used may be converted to OCT. Consider, for example, that there are one hundred (100) driver units and each driver unit has an output impedance of 5,000 ohms. Further consider that fifty (50) driver units may be converted to OCT, twenty-five (25) driver units may be always driving high, and twenty-five (25) driver units may be always driving low. In this case, the output current will be reduced by fifty percent (50%), thus reducing VOD by 50% while maintaining an output impedance of 50 ohms. The above-described FIG. 2 shows one way to implement programmable pre-emphasis that uses a fixed tap arrangement. In the fixed tap arrangement, each tap has its own dedicated driver slices 207. If one tap is not used, the driver slices 207 associated with that tap are tri-stated. This fixed tap arrangement requires only one re-timing slice 205 per tap, but it does require a number of driver slices 207 that is equal to the number of pre-emphasis taps.

Another way to implement programmable pre-emphasis uses a floating tap arrangement. Such a floating tap arrangement may be used to reduce the number of driver units required, reducing the parasitic capacitance on the pin. Since the total output impedance is fixed, the total number of driver units for all taps is fixed. This makes it possible to share driver units among taps. Such sharing of driver units among taps may be achieved by using multiplexers such that each driver slice may receive the output from all the pre-emphasis taps. However, the use of such multiplexers involves undesirable delays and switching power.

Figure 9:
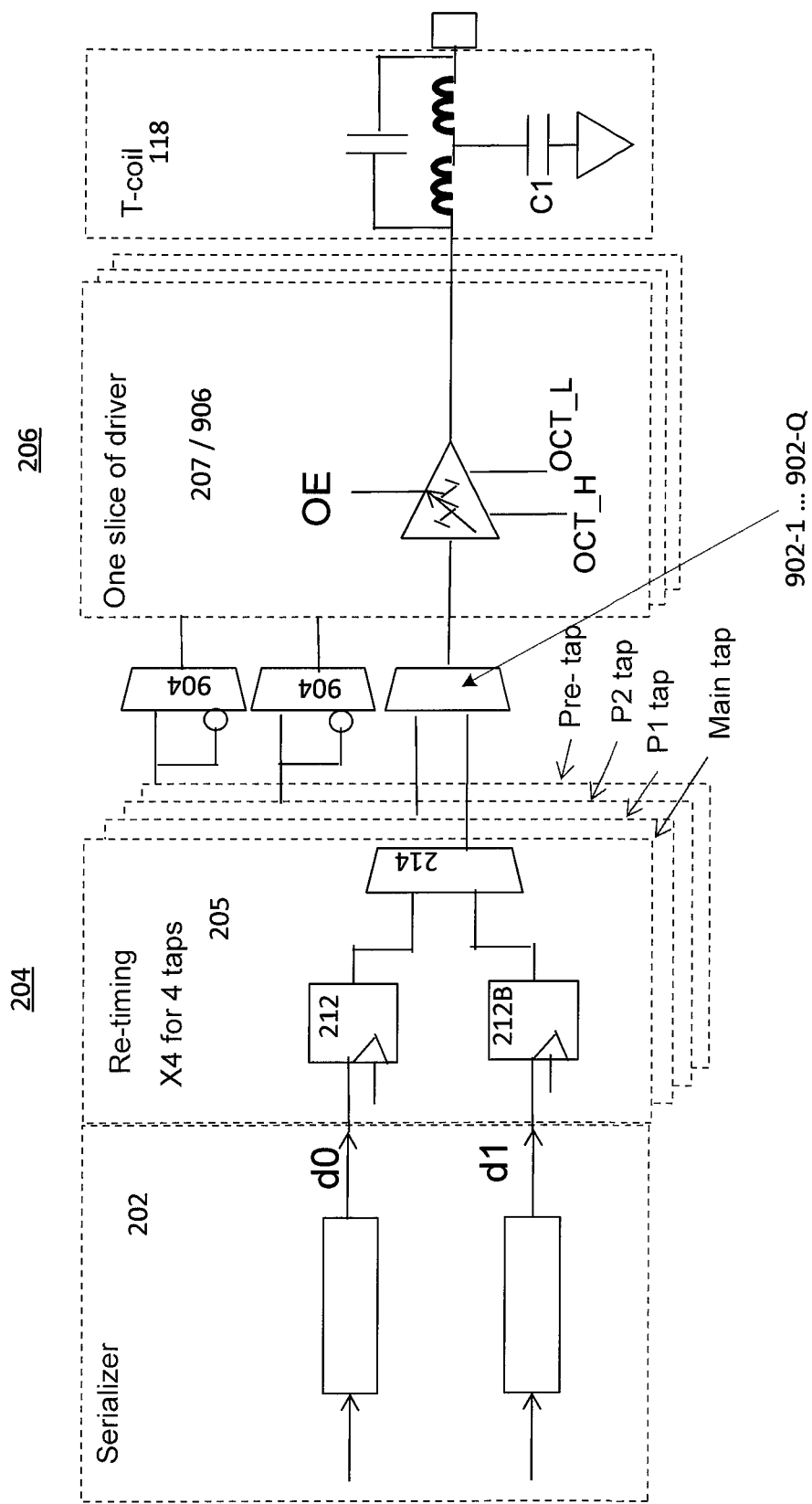
FIG. 9 depicts a voltage-mode driver with a partial floating tap arrangement in accordance with an embodiment of the invention.

In accordance with an embodiment of the invention, an advantageous compromise solution is a partial floating tap arrangement, such as depicted in FIG. 9. In this example, there are four re-timing taps: main tap; post 1 (P1) tap; post 2 (P2) tap; and pre-tap.

As shown, the pre-tap and P2 tap outputs go to individually programmable inversion multiplexers 904. Each programmable inversion multiplexers 904 may provide its output to a set of driver slices 207.

The main tap and the P1 tap are always in opposite polarity, so no programmable inversion is needed for them. To match the delay of all taps, the main tap and P1 tap go through multiple 2:1 multiplexers (902-1 through 902-Q) to corresponding "shared" driver slices 207, where Q is the number of shared driver slices 906. In one implementation, Q may be one hundred (100), for instance. Each multiplexer 902-x may route either the signal for the main tap or for the P1 tap to the corresponding driver slice 207.

Figure 10:
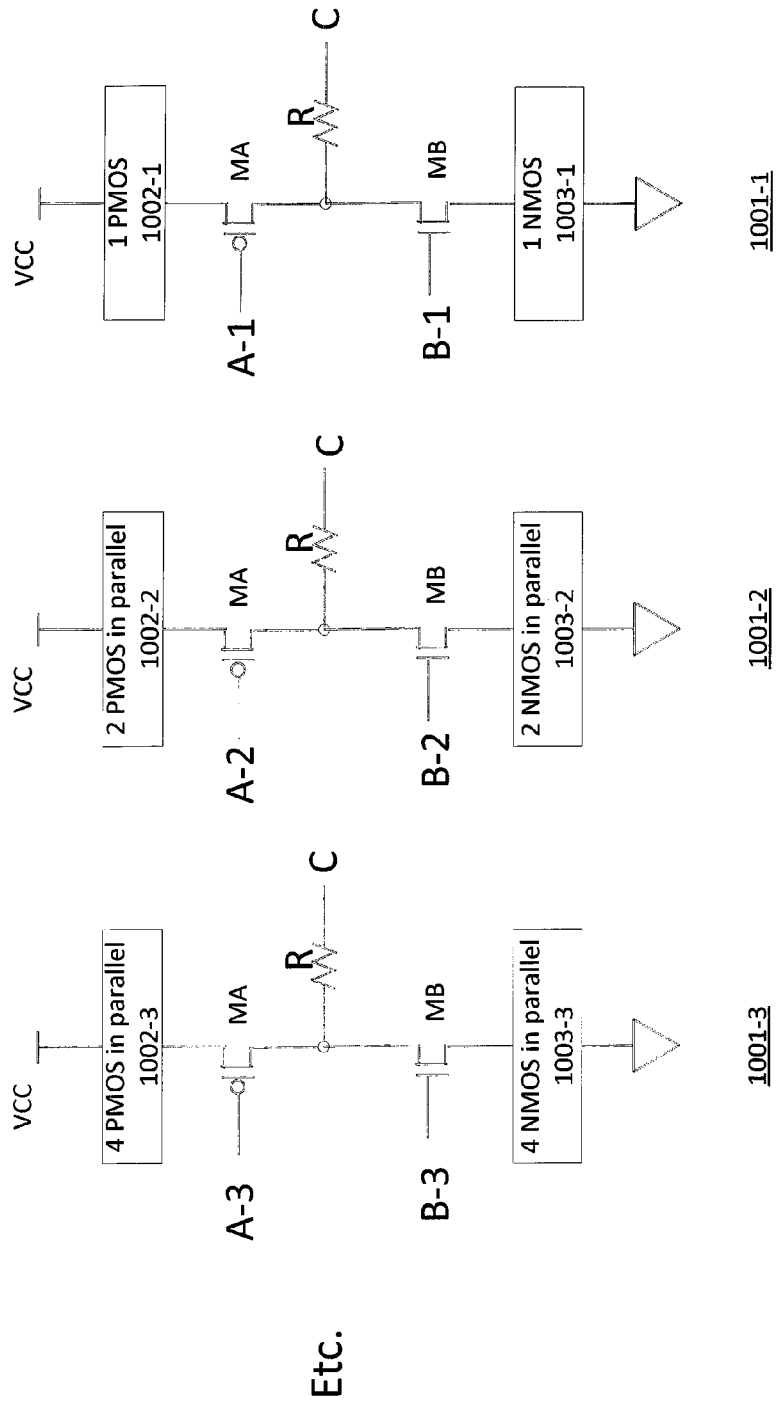
FIG. 10 depicts the shared driver slice that may be shared by the main and P1 taps in accordance with an embodiment of the invention.

FIG. 10 depicts the shared driver slice 906 that may be shared by the main and P1 taps in accordance with an embodiment of the invention. The shared driver slice 906 includes Q fixed-strength drivers 1001-1 through 1001-Q. As shown in FIG. 10, the first fixed-strength driver 1001-1 may have PMOS and NMOS transistors (1002-1 and 1003-1) to provide the driving strength of a single driver unit. The second fixed-strength driver 1001-2 may have PMOS and NMOS transistors (1002-2 and 1003-2) to provide the driving strength of two driver units. The third fixed-strength driver 1001-3 may have PMOS and NMOS transistors (1002-3 and 1003-3) to provide the driving strength of four driver units. More generally, the nth fixed-strength driver 1001-n may have PMOS and NMOS transistors to provide the driving strength of $2^{n-1}$ driver units.

Each of the multiplexers 902-n selects either the main tap signal or the P1 tap signal and provides the selected signal to the A-n and B-n inputs of corresponding fixed-strength driver 1001-n. In one implementation, controls signals to the gates of the PMOS and NMOS transistors (1002-n and 1003-n) in each fixed-strength driver 1001-n may be used to control whether or not that individual fixed-strength driver 1001-n is used or not. The output nodes C of the fixed-strength drivers may be connected together (and also connected to the output nodes C of the other driver slices 207). Advantageously, the multiplexers 902-1 through 902-Q may be thus used to distribute the driver units between the main tap and the P1 tap, without needing to cause additional delay or additional power consumption.

Figure 11:
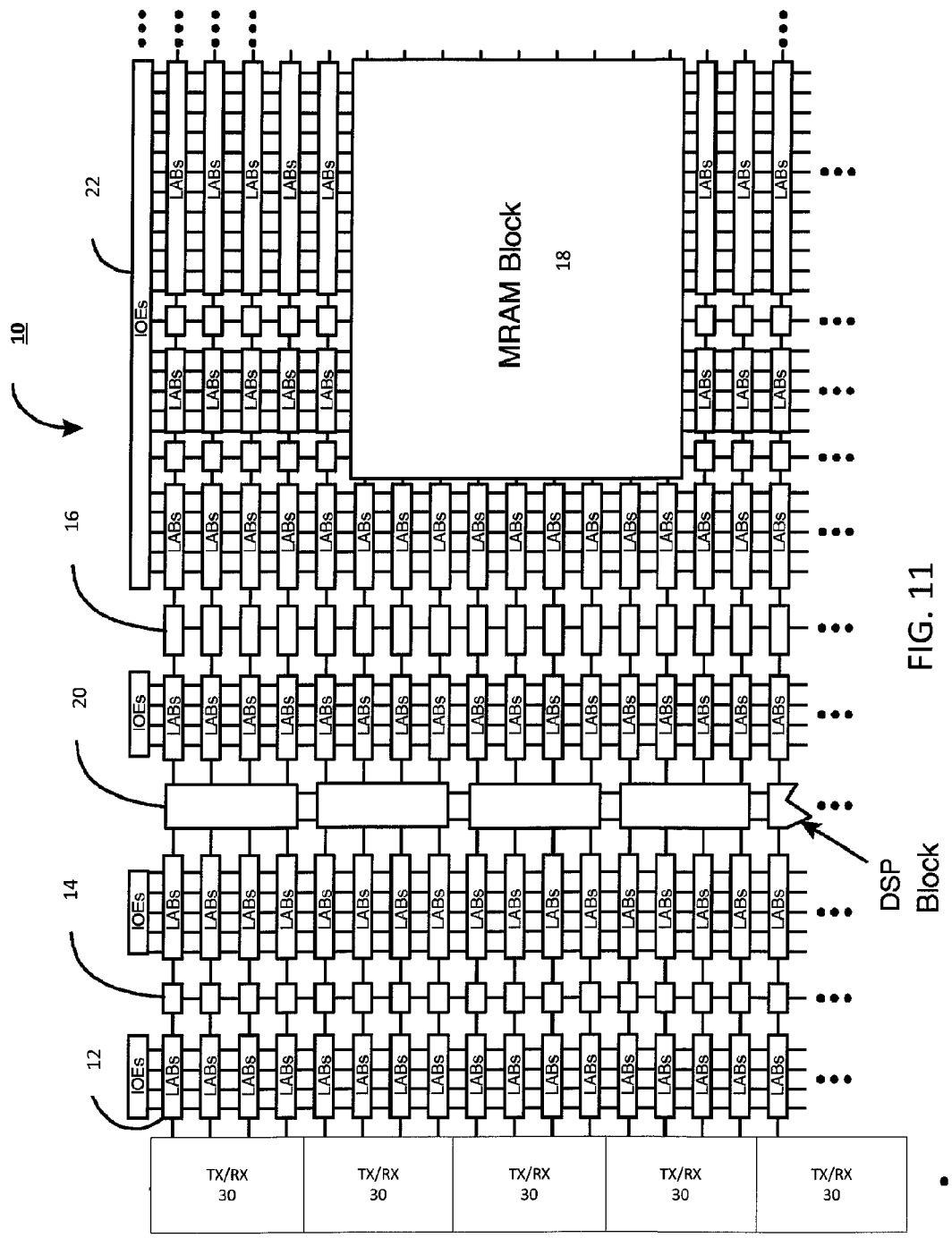
FIG. 11 is a simplified partial block diagram of a field programmable gate array (FPGA) that may include aspects of the present invention.

FIG. 11 is a simplified partial block diagram of a field programmable gate array (FPGA) 10 that may include aspects of the present invention. It is to be understood that FPGA 10 is described herein for illustrative purposes only and that the present invention can be implemented in many different types of integrated circuits, such as programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs). A LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each IOE 22 is coupled to an external terminal (i.e., a pin) of FPGA 10. A transceiver (TX/RX) channel array may be arranged as shown, for example, with each TX/RX channel circuit 30 being coupled to several LABs. A TX/RX channel circuit 30 may include, among other circuitry, a transmitter having a programmable voltage-mode differential driver as disclosed herein.

Figure 12:
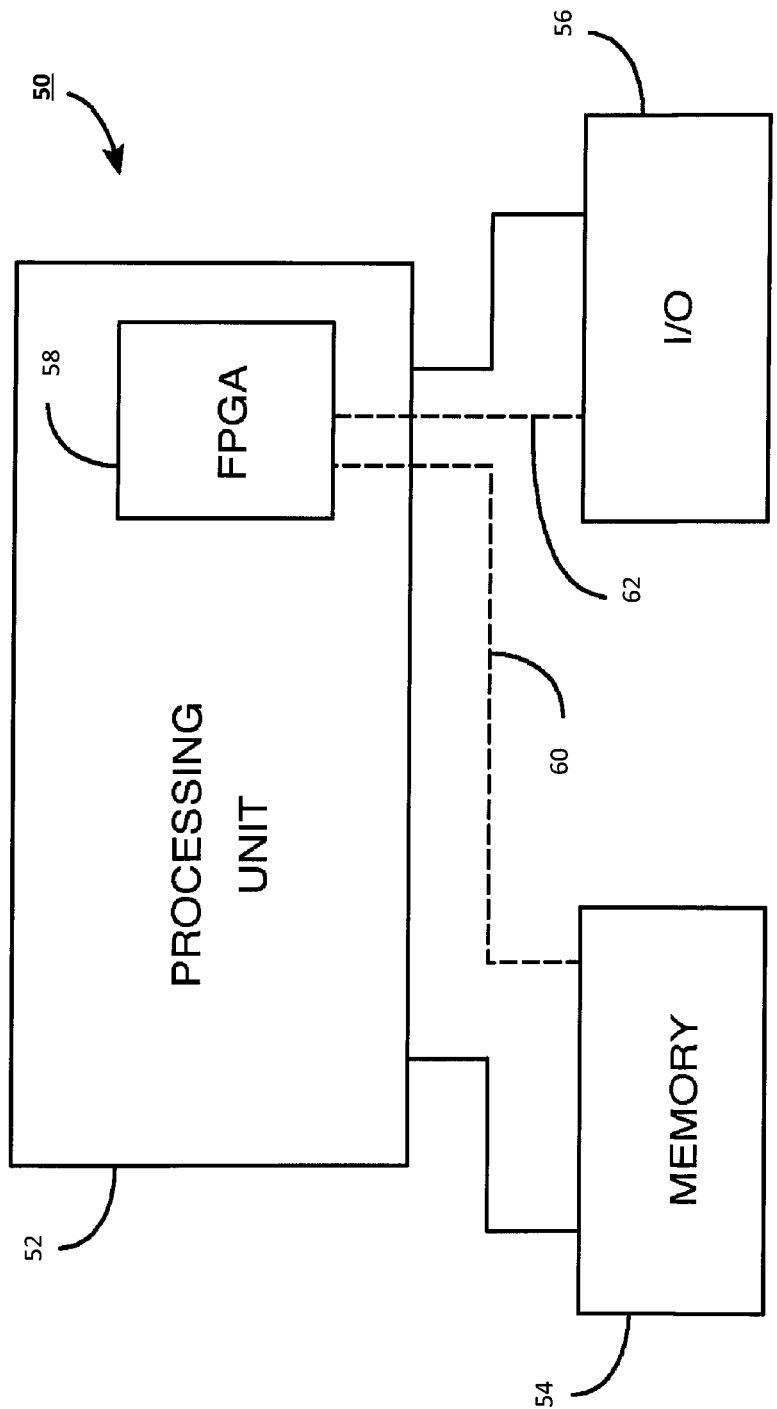
FIG. 12 is a block diagram of an exemplary digital system that may employ techniques of the present invention.

FIG. 12 shows a block diagram of an exemplary digital system 50 that may employ techniques of the present invention. As shown, system 50 may include an FPGA as one of several components. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A differential driver for driving a differential signal, the differential driver comprising:
    a first driver arm comprising a first variable-impedance driver for driving a first single-ended output signal of the differential signal; and
    a second driver arm comprising a second variable-impedance driver for driving a second single-ended output signal of the differential signal;
    a first re-timing block providing a first plurality of re-timed signals to the first variable-impedance driver; and
    a second re-timing block providing a second plurality of re-timed signals to the second variable-impedance driver,
    wherein each said variable-impedance driver comprises multiple driver slices, each driver slice including a pre-driver circuit and a driver circuit.

2. The differential driver of claim 1, wherein each said re-timing block comprises multiple re-timing slices, and wherein each said re-timing slice corresponds to a tap of a pre-emphasis filter.

3. The differential driver of claim 2, wherein each said re-timing slice comprises:
    a first register for receiving a first half-rate data signal;
    a second register for receiving a second half-rate data signal; and
    a multiplexer for multiplexing the first and second half-rate data signals into a full-rate data signal,
    wherein a first single-ended clock signal of a differential clock signal is received by a clock input of the first register, and a second single-ended clock signal of the differential clock signal is received by a clock input of the second register.

4. The differential driver of claim 2 further comprising:
    a first programmable inverter which receives an output of a first re-timing slice corresponding to a pre-tap of the pre-emphasis filter; and
    a second programmable inverter which receives an output of a second re-timing slice corresponding to a second post (P2) tap of the pre-emphasis filter.

5. The differential driver of claim 4 further comprising:
    a plurality of 2:1 multiplexers that each receive outputs of a third re-timing slice corresponding to a first post (P1) tap of the pre-emphasis filter and a fourth re-timing slice corresponding to a main tap of the pre-emphasis filter.

6. The differential driver of claim 1 further comprising:
    a first programmable inversion multiplexer positioned between the first re-timing block and the first variable-impedance driver; and
    a second programmable inversion multiplexer positioned between the second re-timing block and the second variable-impedance driver.

7. The differential driver of claim 1, wherein the pre-driver circuit is configurable into one of four states: a first state which configures the driver circuit to a driver mode; a second state which configures the driver circuit to a tri-state mode; a third state which configures the driver circuit to a first on-chip termination mode; and a four state which configures the driver circuit to a second on-chip termination mode.

8. The differential driver of claim 1, wherein the driver circuit comprises a variable-unit driver circuit.

9. A differential driver for driving a differential signal, the differential driver comprising:
    a first driver arm comprising a first variable-impedance driver for driving a first single-ended output signal of the differential signal; and
    a second driver arm comprising a second variable-impedance driver for driving a second single-ended output signal of the differential signal;
    a first delay control circuit which receives an input differential clock signal and outputs a first skew-corrected differential clock signal for the first driver arm; and
    a second delay control circuit which receives the input differential clock signal and outputs a second skew-corrected differential clock signal for the second driver arm,
    wherein each said variable-impedance driver comprises multiple driver slices, each driver slice including a pre-driver circuit and a driver circuit.

10. A differential driver for driving a differential signal, the differential driver comprising:
    a first driver arm comprising a first variable-impedance driver for driving a first single-ended output signal of the differential signal; and
    a second driver arm comprising a second variable-impedance driver for driving a second single-ended output signal of the differential signal;

a first duty cycle distortion (DCD) control circuit which receives an input differential clock signal and outputs a first DCD-corrected differential clock signal for the first driver arm; and a second DCD control circuit which receives the input differential clock signal and outputs a second DCD-corrected differential clock signal for the second driver arm, wherein each said variable-impedance driver comprises multiple driver slices, each driver slice including a pre-driver circuit and a driver circuit.

11. The differential driver of claim 10 further comprising:

a first DCD detection circuit which receives a first single-ended output signal from the first variable-impedance driver and provides a first DCD control signal to the first DCD control circuit; and a second DCD detection circuit which receives a second single-ended output signal from the second variable-impedance driver and provides a second DCD control signal to the second DCD control circuit.

12. A differential driver for driving a differential signal, the differential driver comprising:

a first driver arm comprising a first variable-impedance driver for driving a first single-ended output signal of the differential signal; and a second driver arm comprising a second variable-impedance driver for driving a second single-ended output signal of the differential signal, wherein each said variable-impedance driver comprises multiple driver slices, each driver slice including a pre-driver circuit and a driver circuit, wherein the driver circuit comprises a variable-unit driver circuit, and wherein the variable-unit driver circuit comprises:

a plurality of PMOS transistor sets having different numbers of PMOS transistors arranged in parallel; and a plurality of NMOS transistor sets having different numbers of NMOS transistors arranged in parallel.

13. The differential driver of claim 12, wherein each said transistor set is controlled by a control signal that controls whether the transistor set is used or un-used.

14. The differential driver of claim 1 further comprising:

an on-chip termination circuit positioned between outputs of the first and second variable-impedance drivers.

15. A method for driving a differential signal, the method comprising:

providing a first plurality of re-timed signals to a first variable-impedance driver in a first driver arm; and providing a second plurality of re-timed signals to a second variable-impedance driver in a second driver arm, wherein each said variable-impedance driver comprises multiple driver slices, each driver slice including a pre-driver circuit and a driver circuit.

16. The method of claim 15 further comprising:

generating the first plurality of re-timed signals using a first re-timing block; and generating the second plurality of re-timed signals using a second re-timing block, wherein each said re-timing block comprises multiple re-timing slices, and wherein each said re-timing slice corresponds to a tap of a pre-emphasis filter.

17. The method of claim 15, wherein the driver circuit comprises a variable-unit driver circuit, further comprising:

programmably configuring the variable-unit driver circuit of each driver slice to have a driving strength equal to a number of driving units.

18. The method of claim 15 further comprising:

adjusting a output voltage swing by changing a common mode reference voltage applied to on-chip termination circuitry between the first driver arm and the second driver arm.

19. An integrated circuit comprising:

a first data output pin;

a second data output pin;

a first driver arm comprising a first variable-impedance driver for driving a first single-ended output signal of a differential signal onto the first data output pin; and a second driver arm comprising a second variable-impedance driver for driving a second single-ended output signal of the differential signal onto the second data output pin;

a first re-timing block providing a first plurality of re-timed signals to the first variable-impedance driver; and a second re-timing block providing a second plurality of re-timed signals to the second variable-impedance driver, wherein each said variable-impedance driver comprises multiple driver slices, each driver slice including a pre-driver circuit and a driver circuit.

* * * * *